US006626187B2

(12) United States Patent
Yang et al.

(10) Patent No.: US 6,626,187 B2
(45) Date of Patent: Sep. 30, 2003

(54) METHOD OF RECONDITIONING REACTION CHAMBER

(75) Inventors: Teng-Thun Yang, Chiayi Hsien (TW); Chun-Wei Chen, Hsinchu (TW)

(73) Assignee: Promos Technologies Inc., Hsinchu (TW)

( * ) Notice: Subject to any disclaimer, the term of this patent is extended or adjusted under 35 U.S.C. 154(b) by 224 days.

(21) Appl. No.: 09/815,796

(22) Filed: Mar. 23, 2001

(65) Prior Publication Data

US 2002/0104549 A1 Aug. 8, 2002

(30) Foreign Application Priority Data

Feb. 7, 2001 (TW) ........................................ 90102585 A

(51) Int. Cl.⁷ .............................. B08B 6/00; B08B 7/00
(52) U.S. Cl. .......................... 134/1.1; 134/1.2; 134/1.3; 134/2; 134/25.1; 134/21; 134/26; 156/643.1; 427/535
(58) Field of Search .............................. 134/1, 1.1, 1.2, 134/1.3, 2, 25.1, 21, 26, 34, 37, 39; 156/643.1; 427/535

(56) References Cited

U.S. PATENT DOCUMENTS 5,741,396 A * 4/1998 Loewenstein ................ 438/724
5,969,425 A * 10/1999 Chen et al. .................. 257/774
5,993,916 A * 11/1999 Zhao et al. .................. 427/535

* cited by examiner

Primary Examiner—Randy Gulakowski
Assistant Examiner—Gentle E. Winter
(74) Attorney, Agent, or Firm—J.C. Patents

(57) ABSTRACT

A method of reconditioning the reaction chamber of an etching reactor and controlling critical dimensions of an etch layer. After dry-cleaning or preventive maintenance, gaseous nitrogen and hydrogen are introduced into the reaction chamber and a dummy wafer is placed inside the reaction chamber. A radio frequency (RF) power source is switched on to initiate a wafer etching operation. Photoresist material on the dummy wafer reacts with the gases inside the reaction chamber to form high molecular weight particles so that the chamber is reconditioned within a very short time. Alternatively, instead of a dummy wafer, a production wafer with an etch-pending layer that can react with gaseous nitrogen and oxygen may be placed inside the reaction chamber after a dry cleaning or preventive maintenance. Gaseous nitrogen and hydrogen are introduced into the reaction chamber and then RF power is switched on to initiate wafer etching. The gases inside the reaction chamber react with the production wafer to produce high molecular weight particles rapidly, thereby in-situ reconditioning the reaction chamber. Moreover, the gaseous mixture reacts with the etch-pending layer on the wafer in a controlled manner so that critical dimensions are more accurate and sidewalls are closer to the vertical.

7 Claims, 2 Drawing Sheets

METHOD OF RECONDITIONING REACTION CHAMBER

BACKGROUND OF THE INVENTION

1. Field of Invention

The present invention relates to a method of manufacturing semiconductor devices. More particularly, the present invention relates to a method of reconditioning a reaction chamber and controlling the critical dimension of an etching layer.

2. Description of Related Art

After using a chemical vapor deposition (CVD) reactor or an etching reactor for a period of time, reacted material or high molecular weight material is often deposited on the interior surface of the reaction chamber. The coated material is only loosely attached to the reactor sidewalls. Hence, the material may easily come off to become polluting particles inside the reaction chamber during a subsequent process.

To prevent accumulation of too much pollution inside a reaction chamber, a CVD reactor or an etching reactor is dry-cleaned after a set period so that micro-particles attached to the interior sidewalls of the reaction chamber are removed. Furthermore, after a long period of operation and a definite number of dry cleanings, a preventive maintenance (PM) of the reaction chamber is often conducted to restore the reaction chamber to ideal operating conditions.

In a typical processing situation such as an etching operation, a few micro-particles often remain attached to the interior sidewalls of the reaction chamber. However, after dry cleaning or preventive maintenance, micro-particles are no longer attached to the interior surfaces of the reaction chamber. The micro-particle-free condition immediately after a dry cleaning or a preventive maintenance frequently leads to a lowering of the etching rate and a deterioration of etching uniformity. Hence, a seasoning step is required to recondition the reaction chamber after a dry cleaning or a preventive maintenance.

Conventionally, to recondition a reaction chamber after a dry cleaning or routine preventive maintenance, a dummy wafer is placed inside the reaction chamber. Thereafter, gases including trifluoromethane, carbon tetrachloride, argon and oxygen are introduced into the reaction chamber. Finally, an oxygen plasma etching is carried out for a prescribed period so that some micro-particles are again attached to the interior surfaces of the reaction chamber.

However, the aforementioned reconditioning method has several drawbacks, including:

1. To recondition the interior of the reaction chamber, an etching operation with oxygen plasma must be performed for over an hour after each dry cleaning or preventive maintenance. This is a long time.
2. Because more than an hour of oxygen plasma etching is required after each dry cleaning or preventive maintenance, the dummy wafer is consumed quickly. Hence, the dummy wafer placed inside the reaction chamber needs constant replacement. In addition, special gases need to be introduced into the reaction chamber during reconditioning, therefore increasing dry-cleaning and preventive maintenance cost.
3. Since the reconditioning after each dry cleaning and preventive maintenance is time consuming, the dry cleaning cycle is likely extended. However, by extending the dry cleaning cycle, more high-molecular-weight particles accumulate on the interior surfaces of the reaction chamber, leading to a shorter preventive maintenance cycle and reducing the utilization rate of the equipment.
4. After the reaction chamber is resumed, the gaseous nitrogen and oxygen are introduced into the reaction chamber to react with the etched layer, but the gaseous source can not easily control the critical dimension of the etched layer.

SUMMARY OF THE INVENTION

Accordingly, one object of the present invention is to provide a method of reconditioning a reaction chamber such that the reaction chamber can resume normal operation within the shortest possible period.

A second object of this invention is to provide a method of reconditioning a reaction chamber such that cost of dry-cleaning and preventive maintenance is reduced.

A third object of this invention is to provide a method of reconditioning a reaction chamber such that the preventive maintenance cycle for the reaction chamber is extended and the utilization rate of the equipment use time is increased.

A fourth object of this invention is to provide a method of controlling an etching layer such that the etched layer has vertical sidewalls and an accurate critical dimension.

To achieve these and other advantages and in accordance with the purpose of the invention, as embodied and broadly described herein, the invention provides a method of reconditioning the reaction chamber of an etching reactor. After several wafer etching operations, a dry cleaning or a preventive maintenance of the reaction chamber is carried out. After the dry-cleaning or preventive maintenance, gaseous nitrogen and hydrogen are introduced into the reaction chamber and a dummy wafer is placed inside the reaction chamber. A radio frequency (RF) power source is switched on to initiate a wafer etching operation. Photoresist material on the dummy wafer reacts with the gases inside the reaction chamber to form high molecular weight particles so that the reaction chamber is reconditioned within a very short time. Alternatively, instead of a dummy wafer, a production wafer that requires actual etching may be placed inside the reaction chamber after dry cleaning or preventive maintenance. To recondition the reaction chamber, gaseous nitrogen and hydrogen are introduced into the reaction chamber and then RF power is switched on to initiate wafer etching. The gases inside the reaction chamber react with the production wafer for rapid production of high molecular weight particles. Therefore, the reaction chamber is reconditioned in-situ in the wafer etching operation. In addition, the presence of gaseous nitrogen and hydrogen inside the reaction chamber makes the etching reaction of the production wafer proceed in a controlled manner. Hence, critical dimensions of the etched layer on the production wafer are more accurately controlled while nearly vertical sidewalls are produced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
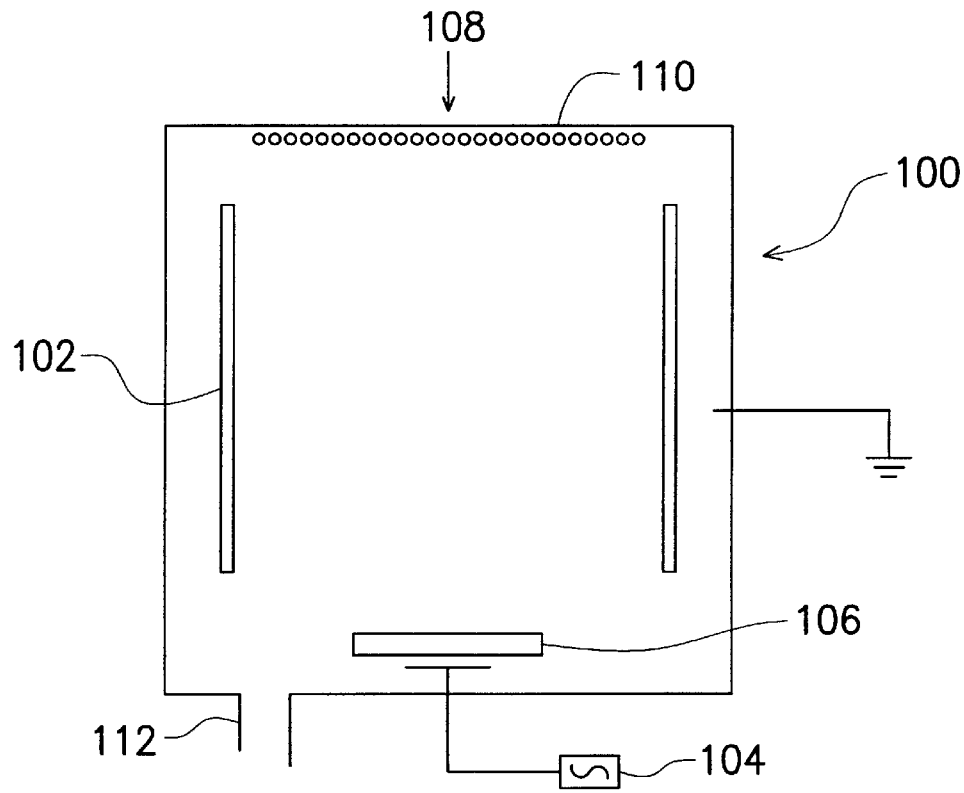
FIGS. 1 and 2 are schematic cross-sectional views showing the process of reconditioning a reaction chamber according to a preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
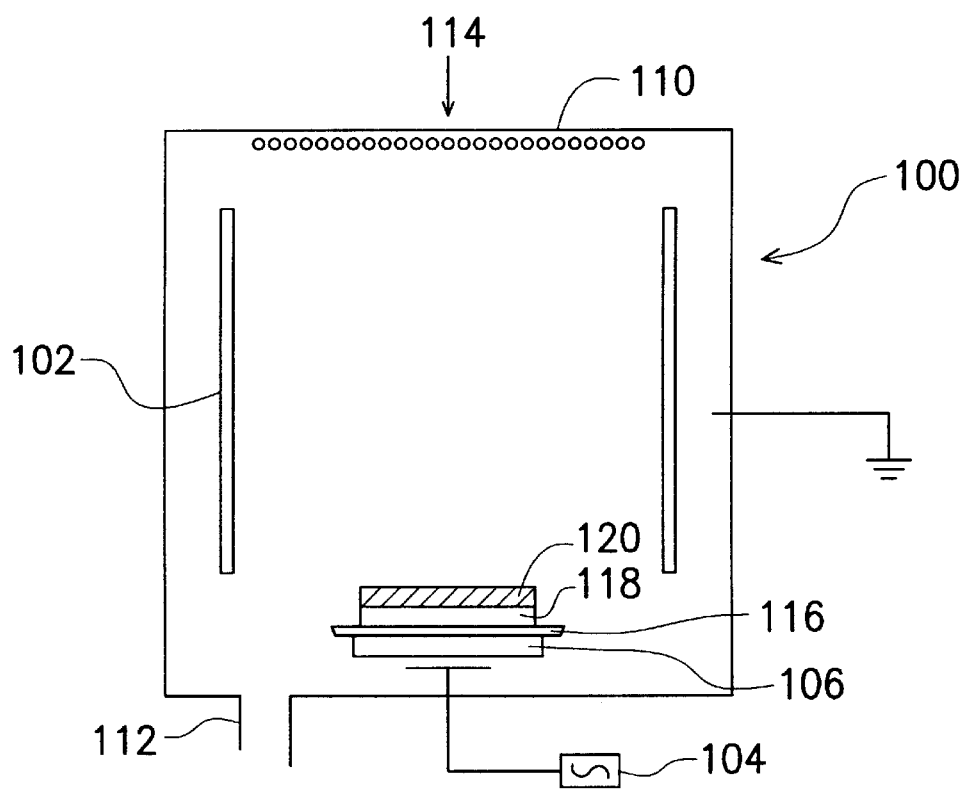

FIGS. 1 and 2 are schematic cross-sectional views showing the process of reconditioning a reaction chamber according to a preferred embodiment of this invention. In general, a quantity of high molecular weight particles attaches to the interior sidewalls of a reaction chamber 100 after each production cycle. After several production cycles, the reaction chamber 100 requires a dry cleaning operation to remove some of these particles and then a preventive maintenance is conducted after several dry cleaning cycles. Dry cleaning and preventive maintenance of the reaction chamber is repeated in cycles thereafter. To perform a dry cleaning, a dummy wafer (not shown) having a silicon layer thereon is placed inside the reaction chamber 100 shown in FIG. 1. Gas 108 is introduced into the reaction chamber 100 from a top gas-distributing panel 110. Meanwhile, a radio frequency RF power switch 104 is turned on. The RF power provides an output of about 700W and has a RF frequency of about 13.6 MHz, for example. The gas delivered into the reaction chamber 110 is a mixture that includes nitrogen fluoride, oxygen and nitrogen mixed in a ratio of about 10:48:30. However, because all the high molecular weight micro-particles inside the reaction chamber 100 are removed after a dry cleaning or preventive maintenance operation, the reaction chamber needs to be reconditioned into a state suitable for actual wafer etching.

With reference to FIG. 2, gases 108 inside the reaction chamber 110 are exhausted through the outlet 112. A dummy wafer 118 having a photoresist layer 120 thereon is placed on an electrostatic chuck 116 and then the electrostatic chuck 116 is positioned over a lower electrode 106 inside the reaction chamber 100. Gas 114 is introduced into the reaction chamber 100 and then the RF power 104 is switched on to carry out an etching step for reconditioning the reaction chamber 100. The gas 114 is a gaseous mixture that includes nitrogen and hydrogen mixed in a 50:50 ratio. The RF power 104 is turned on for about 1 minute. Since the gas 114 reacts with the photoresist layer 120 on the dummy wafer 118 to form high molecular weight micro-particles, the reaction chamber 100 returns to actual operating condition in a very short time.

If the gaseous source in an actual production etching includes nitrogen and hydrogen, the reconditioning operation can be carried out in-situ with an actual production wafer immediately after a cleaning operation. Moreover, using a gaseous source that includes gaseous nitrogen and hydrogen to react with production wafer often leads to a better control of critical dimension in an etched layer and produces highly vertical sidewalls. The etched layer, for example, can be an anti-reflection coating.

Figure 3:
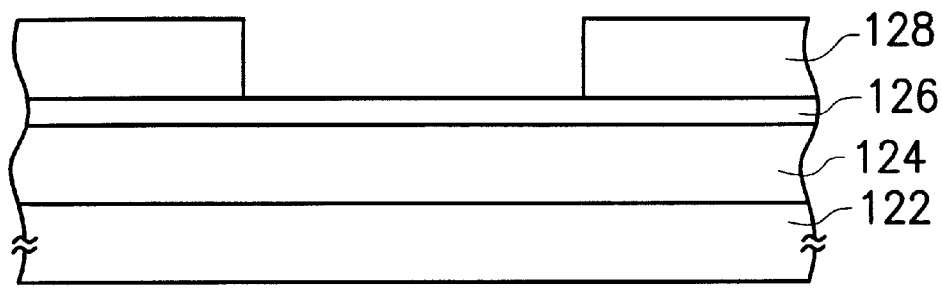
FIG. 3 is a schematic cross-sectional view of a production wafer with an etch-pending layer according to this invention.

FIG. 3 is a schematic cross-sectional view of a production wafer with an etch-pending layer according to this invention. As shown in FIG. 3, an insulation layer 124, an etch-pending layer 126 and a photoresist layer 128 are sequentially formed over a wafer 122. The insulation layer can be a silicon oxide layer and the etch-pending layer 126 can be an anti-reflection coating, for example. After nitrogen and hydrogen from the gaseous source 114 (FIGS. 1 and 2) react with the etch-pending layer 126 and the photoresist layer 128 above the wafer 122, the method shown in FIG. 1 can be used to clean the reaction chamber 100.

Figure 4:
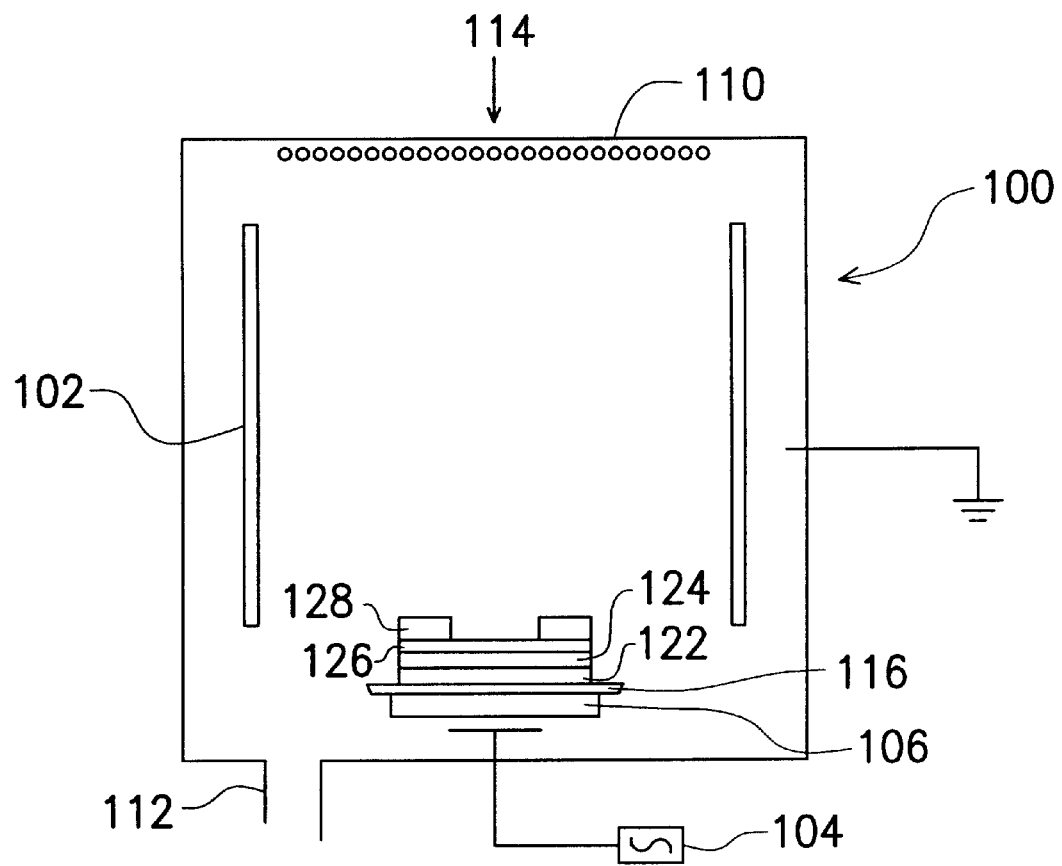
FIG. 4 is a schematic cross-sectional view illustrating an in-situ reconditioning of a reaction chamber according to a preferred embodiment of this invention.

FIG. 4 is a schematic cross-sectional view illustrating an in-situ reconditioning of a reaction chamber according to a preferred embodiment of this invention. Gases 108 inside the reaction chamber 110 are exhausted through the outlet 112. The wafer 122 having the insulation layer 124, the etch-pending layer 126 and the photoresist layer 128 thereon is placed on the electrostatic chuck 116. The electrostatic chuck 116 is placed over the lower electrode 106 inside the reaction chamber 100. Gas 114 is introduced into the reaction chamber 100 and then the RF power 104 is switched on to carry out an etching of the wafer 122 as well as to recondition the reaction chamber 100. The gas 114 is a gaseous mixture that includes nitrogen and hydrogen mixed in a 50:50 ratio. Since etching the etch-pending layer 126 is the first step in the operation, the etching process is slow at the first beginning. However, once the gas from the gaseous source 114 reacts with the material in the etch-pending layer 124, high molecular weight micro-particles are rapidly generated. Hence, within a few minutes, the reaction chamber 100 returns to a normal operating condition. In other words, while the production wafer is etched, the reaction chamber 100 is reconditioned in-situ. However, after a preventive maintenance, the reaction chamber 100 is preferably reconditioned by placing a dummy wafer 118 inside and performing the aforementioned steps.

According to the aforementioned embodiment, one major characteristic of this invention is the reconditioning of a reaction chamber by introducing gaseous nitrogen and hydrogen into the reaction chamber. The gaseous nitrogen and hydrogen react with the photoresist material on a dummy wafer to generate high molecular weight micro-particles. Hence, the reaction chamber can return to a normal operating state within a very short time.

The reconditioning step can be finished within a very short time. Unlike a conventional reconditioning method that takes more than an hour to complete, consumption of dummy wafer is greatly reduced. Ultimately, dry cleaning and preventive maintenance cost for the reaction chamber are greatly reduced.

Since the reconditioning step can be carried out quickly and easily, dry cleaning cycles can be increased so that a production environment for making higher quality products can be sustained. In addition, by reducing the dry cleaning cycle, the preventive maintenance interval can be extended and utilization rate of the equipment can be increased.

In addition, if the gases in a gaseous source that includes nitrogen and hydrogen can react with the material in an etch-pending layer on a wafer, the reaction chamber can be reconditioned while a production wafer is being etched. This is because large quantities of high molecular weight micro-particles are produced quickly when the first step is the etching of the etch-pending layer. Furthermore, a better control of the critical dimensions of an etch-pending layer is achieved and more vertical sidewalls of the etch-pending layer are produced when the etch-pending layer reacts with gaseous nitrogen and hydrogen.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of reconditioning a reaction chamber comprising:

introducing a first gaseous mixture into the reaction chamber;

turning on a radio frequency power source to initiate a dry cleaning operation that removes high molecular weight micro-particles inside the reaction chamber;

placing a production wafer having an etch-pending layer inside the reaction chamber;

introducing a second gaseous mixture containing nitrogen and hydrogen into the reaction chamber; and performing an etching operation to the etch-pending layer of the production wafer and simultaneously reconditioning the reaction chamber in-situ, without using a dummy wafer, wherein the etch-pending layer that is etched by the second gaseous mixture has an accurately controlled critical dimension, and wherein the etch-pending layer is etched by the second gaseous mixture and, at the same time, the second gaseous mixture reacts with the etch-pending layer to form high molecular weight micro-particles for reconditioning the chamber.

2. The method of claim 1, wherein ration of nitrogen to hydrogen in the second gaseous mixture is about 50:50.

3. The method of claim 1, wherein the etch-pending layer includes an anti-reflection coating.

4. The method of claim 1, wherein the dry cleaning operation in the reaction chamber further includes etching with oxygen plasma.

5. The method of claim 1, wherein the first gaseous mixture is a mixture of nitrogen fluoride, oxygen and nitrogen.

6. The method of claim 5, wherein the ratio of nitrogen fluoride, oxygen and nitrogen in the second gaseous mixture is about 10:48:30.

7. The method of claim 1, wherein the radio frequency power source has a power output of about 700W.

* * * * *